United States Patent
Zhang

(10) Patent No.: US 11,482,969 B2
(45) Date of Patent: Oct. 25, 2022

(54) CRYSTAL OSCILLATOR, CHIP, AND ELECTRONIC DEVICE

(71) Applicant: SHENZHEN GOODIX TECHNOLOGY CO., LTD., Shenzhen (CN)

(72) Inventor: Mengwen Zhang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/484,841

(22) Filed: Sep. 24, 2021

(65) Prior Publication Data

US 2022/0077823 A1    Mar. 10, 2022

Related U.S. Application Data

(63) Continuation of application No. PCT/CN2020/114079, filed on Sep. 8, 2020.

(51) Int. Cl.
*H03B 5/06* (2006.01)
*H03B 5/36* (2006.01)

(52) U.S. Cl.
CPC .............. *H03B 5/364* (2013.01); *H03B 5/06* (2013.01); *H03B 5/366* (2013.01); *H03B 2200/005* (2013.01); *H03B 2200/0094* (2013.01)

(58) Field of Classification Search
CPC ... H03B 5/06; H03B 5/30; H03B 5/32; H03B 5/36; H03B 5/362; H03B 5/364; H03B 5/366; H03B 5/368; H03B 2200/005; H03B 2200/0094; H03L 3/00

USPC .................................................. 331/154, 158
See application file for complete search history.

(56) References Cited

U.S. PATENT DOCUMENTS

| | | | |
|---|---|---|---|
| 6,292,064 B1 * | 9/2001 | Nagata | H03B 5/1243 331/177 V |
| 6,337,603 B1 * | 1/2002 | Kinugasa | H03B 5/36 331/177 V |
| 6,624,484 B2 | 9/2003 | Christensen | |
| 6,992,532 B2 | 1/2006 | Christensen | |
| 7,113,022 B2 | 9/2006 | Kim | |

(Continued)

FOREIGN PATENT DOCUMENTS

| CN | 1607726 A | 4/2005 |
|---|---|---|
| CN | 102832903 A | 12/2012 |

(Continued)

*Primary Examiner* — Levi Gannon

(57) ABSTRACT

Disclosed are a crystal oscillator, a chip, and an electronic device. The crystal oscillator includes: an oscillating circuit, including: a crystal, an amplification circuit, a first load capacitor, and a second load capacitor, where the first load capacitor and the second load capacitor are respectively connected to a first terminal and a second terminal of the crystal; and a first Miller multiplication circuit, where an input terminal and an output terminal of the first Miller multiplication circuit are respectively connected to two terminals of the first load capacitor, and the first Miller multiplication circuit is configured to increase a first load capacitance of the oscillating circuit, where the first load capacitance is a capacitance between the first terminal of the crystal and the ground. According to this technical solution, an area occupied by the load capacitor as well as circuit costs can be reduced.

19 Claims, 11 Drawing Sheets

(56) References Cited

U.S. PATENT DOCUMENTS

| | | | |
|---|---|---|---|
| 7,183,868 B1 * | 2/2007 | Wessendorf | H03K 3/3545 |
| | | | 331/158 |
| 7,436,240 B2 | 10/2008 | Kim | |
| 9,172,327 B2 | 10/2015 | Mai | |
| 10,848,102 B2 | 11/2020 | Zhang | |
| 2003/0025579 A1 | 2/2003 | Christensen | |
| 2003/0090297 A1 * | 5/2003 | Sato | H03B 5/362 |
| | | | 327/101 |
| 2004/0021181 A1 | 2/2004 | Christensen | |
| 2005/0099221 A1 | 5/2005 | Kim | |
| 2006/0273845 A1 | 12/2006 | Kim | |
| 2007/0126485 A1 * | 6/2007 | Tateyama | H03B 5/366 |
| | | | 327/156 |
| 2009/0066433 A1 * | 3/2009 | Yamamoto | H03B 5/366 |
| | | | 331/182 |
| 2015/0061786 A1 | 3/2015 | Mai | |
| 2019/0288644 A1 | 9/2019 | Zhang | |

FOREIGN PATENT DOCUMENTS

| | | |
|---|---|---|
| CN | 104426479 A | 3/2015 |
| CN | 107565928 A | 1/2018 |
| CN | 108401476 A | 8/2018 |
| CN | 111108684 A | 5/2020 |

\* cited by examiner

CRYSTAL OSCILLATOR, CHIP, AND ELECTRONIC DEVICE

CROSS-REFERENCE TO RELATED APPLICATIONS

This application is a continuation of International Application No. PCT/CN2020/114079, filed on Sep. 8, 2020, the disclosure of which is hereby incorporated by reference in its entirety.

TECHNICAL FIELD

Embodiments of the present application relate to the field of electronic circuits, and more specifically, to a crystal oscillator, a chip, and an electronic device.

BACKGROUND

A crystal oscillator is a crystal element packaged with a quartz crystal and an oscillating circuit thereof, and can use the piezoelectric effect to provide stable and precise single-frequency oscillations in a state of resonance, thereby generating a clock frequency signal required by a processor, for example, a central processing unit (CPU), to execute instructions. Therefore, any electronic device containing a processor contains at least one clock source, that is, necessarily contains a crystal oscillator. The crystal oscillator is used in many electronic products. To ensure proper operation of electronic products, performance of the crystal oscillator is of great significance.

Therefore, how to improve the overall performance of the crystal oscillator is a technical problem to be solved urgently.

SUMMARY

Embodiments of the present application provide a crystal oscillator, a chip, and an electronic device, which can improve the overall performance of the crystal oscillator.

According to a first aspect, a crystal oscillator is provided, including: an oscillating circuit, including: a crystal, an amplification circuit, a first load capacitor, and a second load capacitor, where two terminals of the crystal are respectively connected to an input terminal and an output terminal of the amplification circuit, and the first load capacitor and the second load capacitor are respectively connected to a first terminal and a second terminal of the crystal; and a first Miller multiplication circuit, where an input terminal and an output terminal of the first Miller multiplication circuit are respectively connected to two terminals of the first load capacitor, and the first Miller multiplication circuit is configured to increase a first load capacitance of the oscillating circuit, where the first load capacitance is a capacitance between the first terminal of the crystal and the ground.

According to the technical solution in this embodiment of the present application, a Miller multiplication circuit is connected in parallel to two terminals of a load capacitor of the crystal oscillator to increase a load capacitance thereof, so that the crystal oscillator has a large oscillatable transconductance area when starting oscillation, which improves the stability of oscillation starting of the crystal oscillator. In addition, an area occupied by the load capacitor as well as circuit costs can be reduced.

In a possible implementation, the first Miller multiplication circuit is configured to increase the first load capacitance to A+1 times a capacitance of the first load capacitor, and A is a gain of the first Miller multiplication circuit.

In a possible implementation, the first Miller multiplication circuit includes: a first multiplication transistor and a second multiplication transistor, where the first multiplication transistor and the second multiplication transistor are connected in series to form an inverting amplification circuit;

a gate and a drain of the first multiplication transistor are connected to each other, a source of the first multiplication transistor is connected to a power supply voltage, and the drain of the first multiplication transistor is connected to a drain of the second multiplication transistor; and a gate of the second multiplication transistor is the input terminal of the first Miller multiplication circuit and is connected to one terminal of the first load capacitor, the drain of the second multiplication transistor is the output terminal of the first Miller multiplication circuit and is connected to the other terminal of the first load capacitor, and a source of the second multiplication transistor is connected to the ground.

According to the technical solution in this embodiment of the present application, the first multiplication transistor works stably in a saturation state and can provide a stable DC bias for the second multiplication transistor. The entire first Miller multiplication circuit is easy to control and works in a relatively stable state. In addition, the Miller multiplication circuit can further provide a more suitable gain and multiply the first load capacitance to a more suitable size range, thereby providing a suitable oscillation-starting transconductance range for the second oscillating transistor.

In a possible implementation, the crystal oscillator further includes: a first switch group configured to connect the first Miller multiplication circuit and the first load capacitor when the crystal oscillator starts oscillation, and to disconnect the first Miller multiplication circuit and the first load capacitor when the crystal oscillator maintains oscillation.

According to the technical solution in this embodiment of the present application, a large-capacity load capacitance can be provided when the crystal starts oscillation, and after the oscillation starting, the crystal maintains oscillation and a small-capacity load capacitance is provided to save the power consumption of the crystal oscillator, so that the crystal oscillator can be applied to more low power application scenarios.

In a possible implementation, the first switch group includes: a first switch, a second switch, and a third switch, where the first switch is connected to the gate of the second multiplication transistor and one terminal of the first load capacitor, the second switch is connected to the drain of the first multiplication transistor and the other terminal of the first load capacitor, and the third switch is connected to the gate of the second multiplication transistor and the power supply voltage;

when the crystal oscillator starts oscillation, the first switch and the second switch are closed, the third switch is opened, and the first Miller multiplication circuit is connected to the first load capacitor to increase the first load capacitance of the oscillating circuit; and when the crystal oscillator maintains oscillation, the third switch is closed, the first switch and the second switch are opened, and the first load capacitance of the oscillating circuit is equal to the capacitance of the first load capacitor.

In a possible implementation, the first Miller multiplication circuit further includes:

at least one first regulating transistor, where a source and a drain of each first regulating transistor in the at least one first regulating transistor are respectively connected to the source and the drain of the first multiplication transistor, and a gate of each first regulating transistor in the at least one first regulating transistor is connected to a gate control voltage.

In a possible implementation, the first Miller multiplication circuit further includes:

at least one first regulating switch, where the at least one first regulating switch is connected to the at least one first regulating transistor in a one-to-one correspondence, and the first regulating switch is configured to control whether to connect the first regulating transistor to the first multiplication transistor.

In a possible implementation, the at least one first regulating switch is configured to adjust a transconductance of the first multiplication transistor, so as to adjust a gain A of the first Miller multiplication circuit.

In the foregoing embodiment of the present application, the gain A of the first Miller multiplication circuit is adjusted, and the first load capacitance in the crystal oscillator is adjusted to an appropriate value, so that the crystal oscillator is easy to start oscillation. Meanwhile, a new means is also provided for adjusting the oscillation frequency of the crystal oscillator.

In a possible implementation, if the at least one first regulating transistor is a plurality of first regulating transistors, the plurality of first regulating transistors are transistors having the same structure.

In a possible implementation, the first Miller multiplication circuit further includes:

at least one second regulating transistor, where a gate, a source, and a drain of each second regulating transistor in the at least one second regulating transistor are respectively connected to the gate, the source, and the drain of the second multiplication transistor.

In a possible implementation, the first Miller multiplication circuit further includes:

at least one second regulating switch, where the at least one second regulating switch is connected to the at least one second regulating transistor in a one-to-one correspondence, and the second regulating switch is configured to control whether to connect the second regulating transistor to the second multiplication transistor.

In a possible implementation, the at least one second regulating switch is configured to adjust a transconductance of the second multiplication transistor, so as to adjust the gain A of the first Miller multiplication circuit.

In a possible implementation, if the at least one second regulating transistor is a plurality of second regulating transistors, the plurality of second regulating transistors are transistors having the same structure.

In a possible implementation, a structure of the at least one second regulating transistor is the same as a structure of the second multiplication transistor.

In a possible implementation, the amplification circuit includes a first oscillating transistor, a second oscillating transistor, and a feedback resistor, where the first oscillating transistor, the second oscillating transistor, and the feedback resistor form an inverting amplification circuit;

a gate of the first oscillating transistor is connected to a gate control voltage, a drain of the first oscillating transistor is connected to the second terminal of the crystal, and a source of the first oscillating transistor is connected to the power supply voltage;

a gate of the second oscillating transistor is connected to the first terminal of the crystal, a drain of the second oscillating transistor is connected to the second terminal of the crystal, and a source of the second oscillating transistor is connected to the ground; and two terminals of the feedback resistor are respectively connected to the two terminals of the crystal.

In a possible implementation, a ratio of a width-to-length ratio of the second multiplication transistor to a width-to-length ratio of the second oscillating transistor is used to adjust the transconductance of the second multiplication transistor and the transconductance of the first multiplication transistor, so as to adjust the gain A of the first Miller multiplication circuit.

In a possible implementation, a ratio of a width-to-length ratio of the second regulating transistor to a width-to-length ratio of the first oscillating transistor is used to adjust the transconductance of the first multiplication transistor, so as to adjust the gain A of the first Miller multiplication circuit.

In a possible implementation, the crystal oscillator further includes: a second Miller multiplication circuit, where an input terminal and an output terminal of the second Miller multiplication circuit are respectively connected to two terminals of the first load capacitor, and the second Miller multiplication circuit is configured to increase a second load capacitance of the oscillating circuit, where the second load capacitance is a capacitance between the second terminal of the crystal and the ground.

In a possible implementation, a circuit structure of the second Miller multiplication circuit is the same as a circuit structure of the first Miller multiplication circuit.

According to a second aspect, a chip is provided, including: the crystal oscillator according to the first aspect or any one of the possible implementations of the first aspect.

In a possible implementation, the chip is a clock chip, and the clock chip is configured to provide a clock signal.

According to a third aspect, an electronic device is provided, including: the chip according to the second aspect or any one of the possible implementations of the second aspect.

The foregoing crystal oscillator is used in the electronic device and chip, and the performance of the crystal oscillator is improved, thereby improving the overall performance of the electronic device and chip

DESCRIPTION OF EMBODIMENTS

The embodiments of the present application are described below with reference to the accompanying drawings in the embodiments of the present application.

The embodiments of the present application may be applicable to an electronic device or an electronic system that includes a processor. The processor may be an integrated circuit chip and has a signal processing capability. The processor may be a general-purpose processor, a digital signal processor (DSP), an application-specific integrated circuit (ASIC), a field-programmable gate array (FPGA) or another programmable logic device, a discrete gate or transistor logic device, or a discrete hardware component. The general-purpose processor may be a microprocessor, or the processor may be any conventional processor, etc.

It should be understood that the specific examples herein are intended only to help persons skilled in the art better understand the embodiments of the present application, rather than limiting the protection scope of the embodiments of the present application.

It should also be understood that the various implementations described in this specification may be implemented separately or in combination, which is not limited in the embodiments of the present application.

Unless otherwise specified, all technical and scientific terms used in the embodiments of the present application have the same meanings as those generally understood by persons of ordinary skill in the art. Terms used in the present application are only for the purpose of describing the specific embodiments, and are not intended to limit the scope of the present application. The term "and/or" used in the present application includes any and all combinations of one or more relevant listed items.

Figure 1:
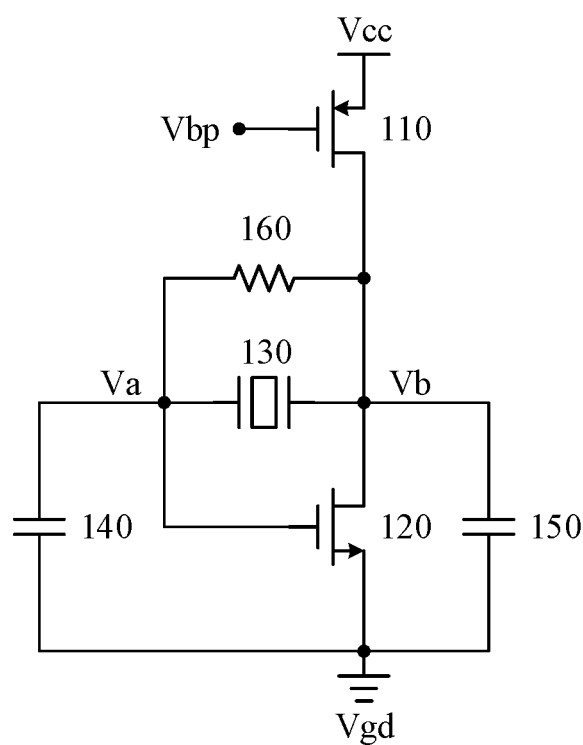
FIG. 1 is a schematic structural diagram of a typical crystal oscillator.

FIG. 1 is a schematic diagram of a typical structure of a crystal oscillator 100. The crystal oscillator 100 has a Pierce oscillator (or referred to as a Pierce crystal oscillator) structure.

As shown in FIG. 1, the crystal oscillator 100 includes a first transistor 110, a second transistor 120, a crystal 130, a first capacitor 140, a second capacitor 150, and a feedback resistor 160.

A gate of the first transistor 110 is connected to a gate control voltage $V_{bp}$, a source of the first transistor is connected to a power supply voltage $V_{cc}$, a drain of the first transistor 110 is connected to a drain of the second transistor 120, and the drain of the second transistor 120 is connected to the ground. In other words, the first transistor 110 and the second transistor 120 form a connection structure of an inverting amplification circuit. The first transistor 110 serves as a current source to supply a bias to the second transistor 120, the feedback resistor 160 and the second transistor 120 form a negative feedback to stabilize a DC voltage across $V_a$ and $V_b$, the first capacitor 140 and the second capacitor 150 serve as load capacitors of the crystal oscillator 100, and the first transistor 110 and the second transistor 120 are configured to provide a transconductance for the crystal 130 to start and maintain oscillation.

However, the crystal oscillator 100 shown in FIG. 1 has the following problems:

A transconductance required by the crystal oscillator 100 to start oscillation is greater than a transconductance required to maintain oscillation, and an excessively large or excessively small transconductance will cause the oscillator not to start oscillation. Therefore, the transconductance of the first transistor 110 and the second transistor 120, especially the transconductance of the second transistor 120, need to be designed in an appropriate interval, otherwise the oscillator cannot start oscillation. There are many factors that determine the transconductance interval, one of which is related to the load capacitance of the crystal oscillator 100, that is, to the capacitance of the first capacitor 140 and the second capacitor 150 in FIG. 1.

In ultra-low power applications, the capacitance of the load capacitors (the first capacitor 140 and the second capacitor 150) of the crystal oscillator 100 is very low, which will cause an oscillatable transconductance interval of the crystal oscillator 100 to become very small, thus posing a challenge to setting a reasonable transconductance. Especially under different processes, temperatures, and voltages, a transconductance deviation can be as high as ±50% or more, causing the crystal oscillator not to start oscillation, thereby affecting a yield thereof.

Figure 2:
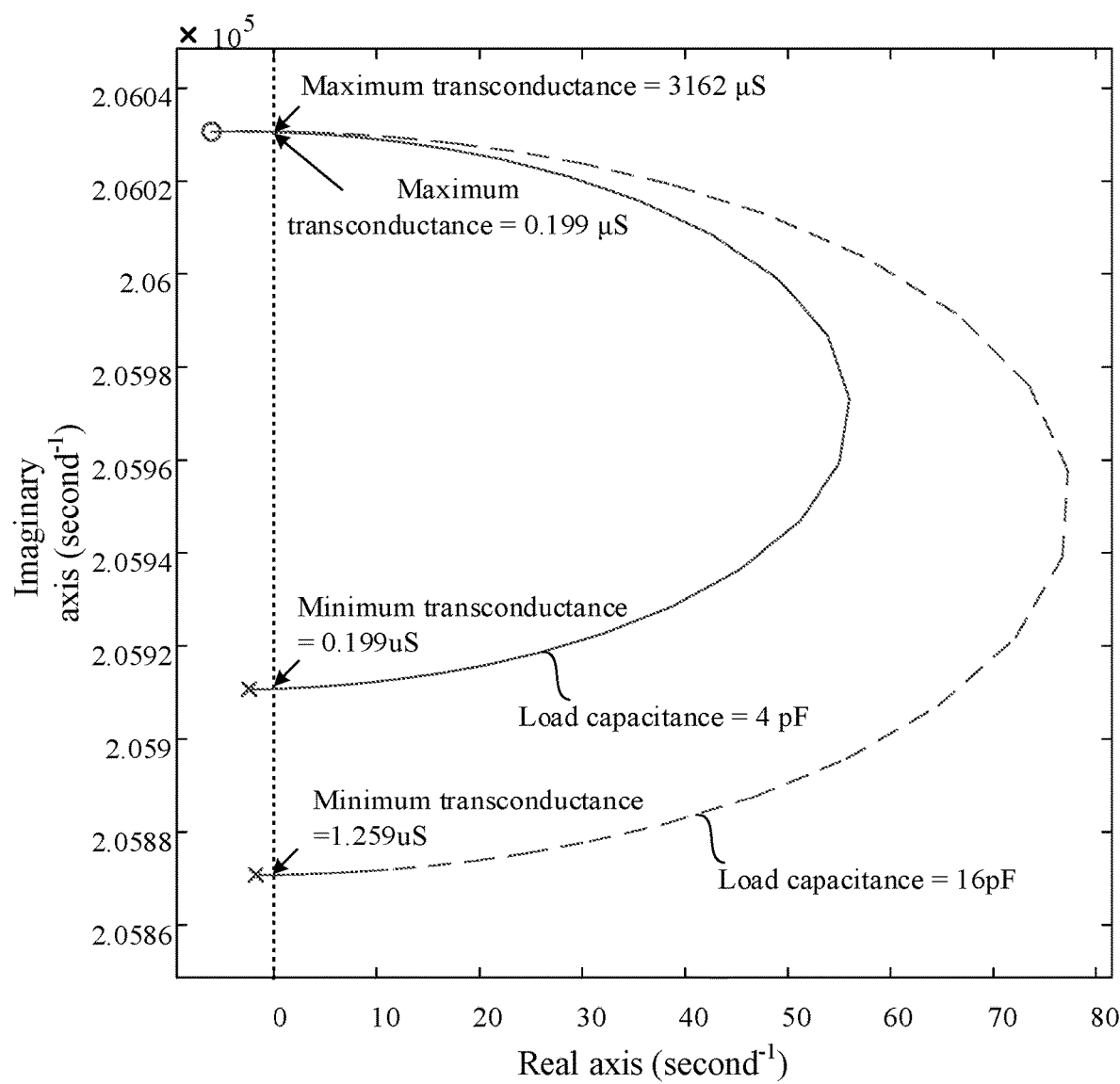
FIG. 2 is a root locus diagram of a closed-loop transfer function of a crystal oscillator under different load capacitances.

FIG. 2 is a root locus diagram of a closed-loop transfer function of a crystal oscillator under different load capacitances.

Specifically, the root locus diagram is a locus diagram of zero-pole of a transfer function versus a gain. In the diagram, the abscissa is the real axis of zero-pole, and the ordinate is the imaginary axis of zero-pole. When the real axis of the zero-pole is greater than or equal to 0, the crystal oscillator starts oscillation.

It can be seen from FIG. 2 that when a load capacitance is 4 pF, an oscillatable transconductance area of the crystal oscillator is 0.199 µs to 199.5 µs. When a load capacitance is 16 pF, an oscillatable transconductance area of the crystal oscillator is 1.259 µs to 3162 µs. Therefore, when the load capacitance is increased, the oscillatable transconductance interval of the crystal oscillator increases significantly. Even if there is a transconductance deviation caused by different processes, temperatures, and voltages, the crystal oscillator can still start oscillation normally because of a relatively large oscillatable transconductance interval of the crystal oscillator.

Figure 3:
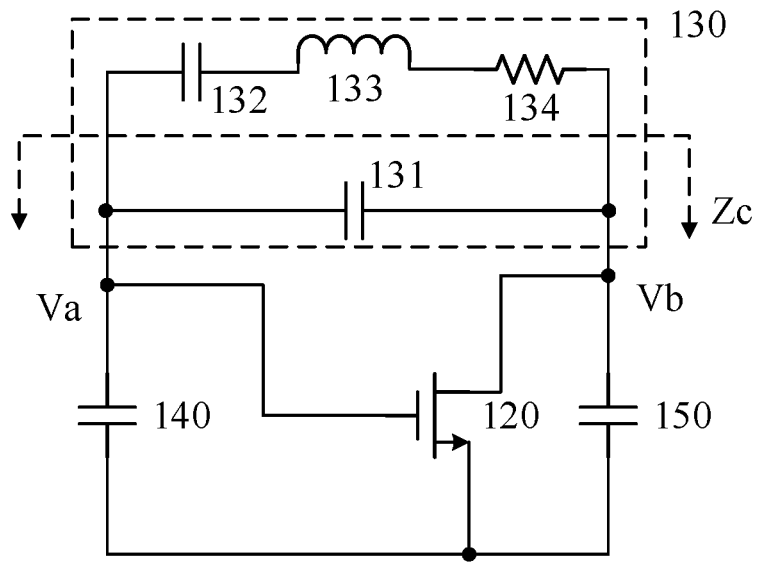
FIG. 3 is an equivalent circuit diagram of a crystal in FIG. 1.

In addition, FIG. 3 is an equivalent circuit diagram of the crystal 130 in FIG. 1.

As shown in FIG. 3, the crystal 130 is equivalent to an equivalent circuit shown by a dashed box in the diagram, including a shunt capacitor 131, an equivalent capacitor 132, an equivalent inductor 133, and an equivalent resistor 134.

According to the Barkhausen criterion, when an LC resonance circuit is at a resonant frequency, the imaginary part of the overall equivalent impedance of the circuit is 0, and if the real part is negative at this time, the LC resonance circuit oscillates. Therefore, as long as it is ensured that a negative resistance value of an impedance $Z_C$ at a resonant frequency of a circuit viewed from two terminals of the shunt capacitor 131 is greater than a resistance value $R_S$ of the equivalent resistor 134 of the crystal, the crystal oscillator can oscillate.

Specifically, a calculation formula for $Z_C$ is as follows:

$$Z_C(j\omega) = \frac{1}{j\omega C_3} \frac{g_m + j\omega(C_1 + C_2)}{g_m + j\omega\left(C_1 + C_2 + \frac{C_1 C_2}{C_3}\right)};$$

a calculation formula for the real part of $Z_C$ is as follows:

$$Z_{C\_real}(j\omega) = -\frac{g_m}{\omega^2 C_1 C_2 \left(\frac{C_1 + C_2}{C_1 C_2} + \frac{1}{C_3}\right)^2 + g_m^2 \frac{C_3^2}{C_1 C_2}};$$

where $C_1$ is a capacitance of the first capacitor 140, $C_2$ is a capacitance of the second capacitor 150, $C_3$ is a capacitance of the shunt capacitor 131, and $g_m$ is a transconductance of the second transistor 120.

To make the crystal oscillator start oscillation, as long as an appropriate $g_m$ is taken to ensure that a negative resistance value of the real part is greater than the resistance value $R_S$ of the equivalent resistor 134, a critical oscillation-starting $g_m$ of the crystal oscillator can be obtained by extracting a root of the following simultaneous equations.

$$\frac{g_m}{\omega^2 C_1 C_2 \left(\frac{C_1+C_2}{C_1 C_2} + \frac{1}{C_3}\right)^2 + g_m^2 \frac{C_3^2}{C_1 C_2}} = R_S;$$

solve for the above equation, to obtain:

$$g_m = \frac{C_1 C_2}{2 R_S C_3^2} \left[ 1 \pm \sqrt{1 - 4\omega^2 R_S^2 C_3^2 \left(\frac{C_3}{C_1} + \frac{C_3}{C_2} + 1\right)^2} \right];$$

perform a first-order Taylor expansion on $g_m$ obtained by solving for the above solution, to obtain an approximate expression thereof as follows:

$$g_m \approx \frac{C_1 C_2}{2 R_S C_3^2} \left\{ 1 \pm \left[ 1 - 2\omega^2 R_S^2 C_3^2 \left(\frac{C_3}{C_1} + \frac{C_3}{C_2} + 1\right)^2 \right] \right\}.$$

According to the above expression, a minimum value $g_{m,min}$ and a maximum value $g_{m,max}$ of $g_m$ can be calculated, and calculation expressions of the two are as follows:

$$g_{m,min} = \omega^2 R_S C_1 C_2 \left(\frac{C_3}{C_1} + \frac{C_3}{C_2} + 1\right)^2;$$

$$g_{m,max} = \frac{C_1 C_2}{R_S C_3^2} - \omega^2 R_S C_1 C_2 \left(\frac{C_3}{C_1} + \frac{C_3}{C_2} + 1\right)^2.$$

If $C_1$ and $C_2$ are much greater than $C_3$, $G_{m,min}$ and $g_{m,max}$ can be further simplified as the following expressions:

$$g_{m,min} = \omega^2 R_S C_1 C_2;$$

$$g_{m,max} = \frac{C_1 C_2}{R_S C_3^2}.$$

Therefore, a value range of the transconductance $g_m$ of the second transistor 120 is as follows:

$$g_{m,range} = C_1 C_2 \left(\frac{1}{R_S C_3^2} - \omega^2 R_S\right).$$

It can be seen from the above expression that, to make the crystal oscillator 100 start oscillation, the value range of transconductance $g_m$ of the second transistor 120 is directly proportional to the capacitance $C_1$ of the first capacitor 140 and the capacitance $C_2$ of the second capacitor 150.

It can be seen from the related description of FIG. 2 and FIG. 3 that, as a capacitance of the load capacitor increases, the oscillatable transconductance interval of the crystal oscillator increases. To improve the stability and reliability of oscillation starting of the crystal oscillator and improve a production yield thereof, it is necessary to design a large-capacitance load capacitor in the crystal oscillator. However, a large-capacitance load capacitor means a large capacity area. For circuits such as crystal oscillators dominant by a capacitor area, an increase in the capacitance of the capacitor means a rise in circuit costs.

Therefore, to resolve the foregoing problem, in the embodiments of the present application, the load capacitance in the crystal oscillator is multiplied by using the Miller effect. In the case of using a small load capacitor, a large load capacitance is obtained by multiplication, so that a large oscillatable transconductance area can be generated, thereby improving the stability of oscillation starting of the crystal oscillator. In addition, an area occupied by the load capacitor as well as circuit costs can be reduced, which is conducive to the miniaturization of the crystal oscillator.

Figure 4:
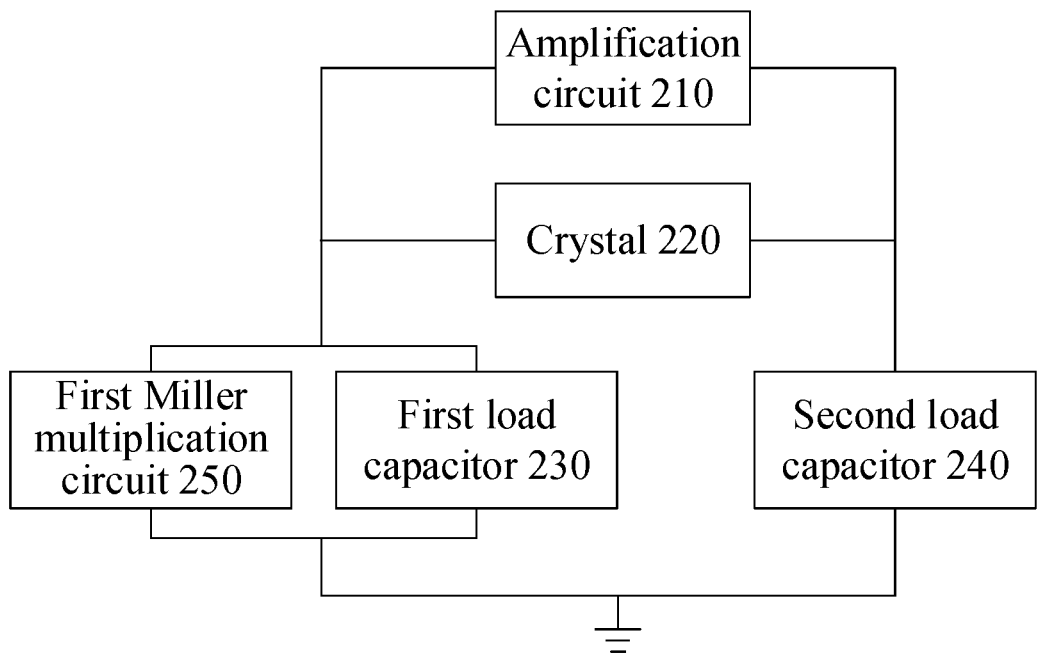
FIG. 4 is a schematic structural block diagram of a crystal oscillator according to an embodiment of the present application.

FIG. 4 is a schematic structural block diagram of a crystal oscillator according to an embodiment of the present application.

As shown in FIG. 4, the crystal oscillator 200 includes: an oscillating circuit and a first Miller multiplication circuit 250, where the oscillating circuit includes an amplification circuit 210, a crystal 220, a first load capacitor 230, and a second load capacitor 240.

Optionally, as shown in FIG. 4, the amplification circuit 210 is connected in parallel to the crystal 220, and the first load capacitor 230 and the second load capacitor 240 are respectively connected to a first terminal and a second terminal of the crystal 220. The first Miller multiplication circuit 250 is connected in parallel to the first load capacitor 230. In other words, an input terminal and an output terminal of the first Miller multiplication circuit are respectively connected to two terminals of the first load capacitor 230.

Optionally, in this embodiment of the present application, the amplification circuit 210 may be an inverting amplification circuit, for example, an inverting amplification circuit formed by the first transistor 110 and the second transistor 120 in the Pierce crystal oscillator shown in FIG. 1. Therefore, the first transistor and the second transistor of the amplification circuit 210 may provide a transconductance for crystal oscillation, which is beneficial to the fast oscillation starting of the crystal.

It may be understood that, in addition to the inverting amplification circuit in the Pierce crystal oscillator, the amplifier circuit 210 may also be other types of amplification circuits in the related art, and a specific circuit structure of the amplification circuit 210 is not limited in the embodiments of the present application.

Correspondingly, the crystal 220, the first load capacitor 230, and the second load capacitor 240 in this embodiment of the present application may be respectively the crystal 130, the first capacitor 140, and the second capacitor 150 in the Pierce crystal oscillator 100 in FIG. 1. The circuit structure formed by the oscillating circuit in this embodiment of the present application is the circuit structure of the Pierce crystal oscillator shown in FIG. 1.

On this basis, the first Miller multiplication circuit 250 is connected in parallel to the first load capacitor 230 to increase a first load capacitance of the oscillating circuit, where the first load capacitance is a capacitance between the first terminal of the crystal 220 and the ground.

Optionally, the first Miller multiplication circuit 250 may be an inverting amplification circuit. According to the principle of the Miller effect, in the inverting amplification circuit, a capacitance value equivalent to the capacitance between the input and the output will be expanded by A+1 times due to the amplification effect of the amplifier, where A is a gain (also referred to as an amplification factor) of the inverting amplification circuit. In other words, in this embodiment of the present application, the first Miller multiplication circuit 250 is configured to increase the first load capacitance to A+1 times a capacitance of the first load capacitor 230, where A is a gain of the first Miller multiplication circuit 250, and A is a positive number.

According to the technical solution in this embodiment of the present application, a Miller multiplication circuit is connected in parallel to two terminals of a load capacitor of the crystal oscillator to increase a load capacitance thereof, so that the crystal oscillator has a large oscillatable transconductance area when starting oscillation, which improves the stability of oscillation starting of the crystal oscillator. In addition, an area occupied by the load capacitor as well as circuit costs can be reduced.

With reference to specific examples in FIG. 5 to FIG. 9, the following describes in detail implementations of the crystal oscillator in the embodiments of the present application.

Figure 5:
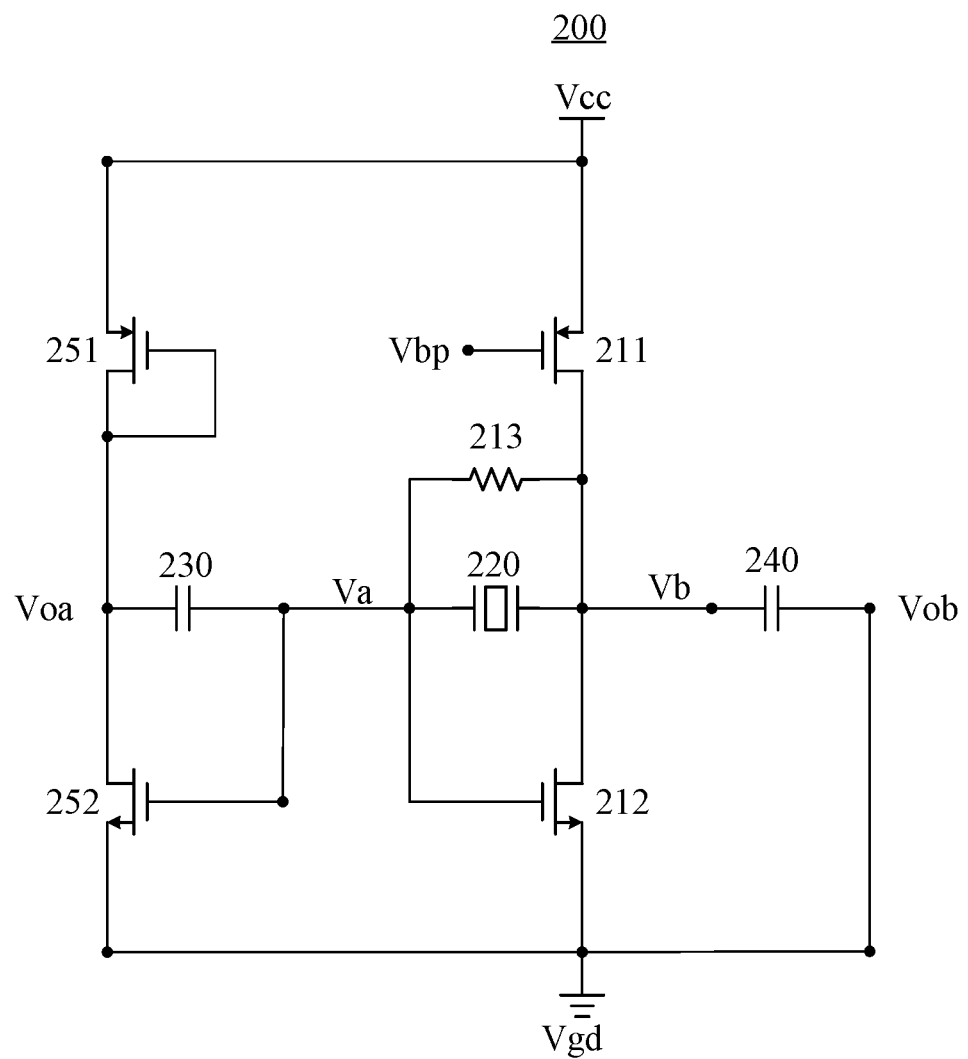
FIG. 5 is a structural diagram of a circuit of a crystal oscillator according to an embodiment of the present application.

FIG. 5 is a structural diagram of a circuit of a crystal oscillator according to an embodiment of the present application.

As shown in FIG. 5, the amplification circuit 210 may include a first oscillating transistor 211, a second oscillating transistor 212, and a feedback resistor 213. The first Miller multiplication circuit 250 may include a first multiplication transistor 251 and a second multiplication transistor 252, where the two multiplication transistors are used to form an inverting amplifier, and the first load capacitor 230 is connected to an input terminal $V_a$ and an output terminal $V_{oa}$ of the inverting amplifier, where the input terminal $V_a$ is also the first terminal of the crystal 220.

Optionally, in the first Miller multiplication circuit, the first multiplication transistor 251 is a P-type channel metal-oxide semiconductor (PMOS) transistor, and the second multiplication transistor 252 is a N-type channel metal-oxide semiconductor (NMOS) transistor.

As an example, as shown in FIG. 5, the first Miller multiplication circuit 250 is a class-A amplification circuit, where a gate and a drain of the first multiplication transistor 251 are connected to each other, and a source of the first multiplication transistor 251 is connected to a power supply voltage $V_{cc}$, so that the first multiplication transistor 251 works in a saturation region. A gate of the second multiplication transistor 252 is an input terminal $V_a$ of the first Miller multiplication circuit 250 and is connected to one terminal of the first load capacitor 230. A drain of the second multiplication transistor 252 is connected to the drain of the first multiplication transistor 251, which is the output terminal $V_{oa}$ of the first Miller multiplication circuit 250 and is connected to the other terminal of the first load capacitor 230. A source of the second multiplication transistor 252 is connected to the ground $V_{gd}$.

In this case, if the gain of the first Miller multiplication circuit 250 is A, a capacitance between $V_a$ and $V_{gd}$ viewed from the input terminal $V_a$ of the first Miller multiplication circuit 250 to the first load capacitor 230, namely, the first load capacitance $C'_1$ of the oscillating circuit, is multiplied to $(1+A)C_1$, where $C_1$ is the capacitance of the first load capacitor 230.

It may be understood that, in the embodiments of the present application, the first Miller multiplication circuit 250 may also be other types of inverting amplifiers in addition to the inverting amplifier structure shown in FIG. 5. For example, the gate and the drain of the first multiplication transistor 251 are not connected, but is connected to a bias voltage. For another example, the gate of the first multiplication transistor 251 is connected to the gate of the second multiplication transistor 252, and is used as the input terminal of the first Miller multiplication circuit 250. A specific circuit structure of the first Miller multiplication circuit 250 is not limited in this embodiment of the present application.

Preferably, the first Miller multiplication circuit 250 is designed as the circuit structure as shown in FIG. 5. In this case, the first multiplication transistor 251 works stably in a saturation state and can provide a stable DC bias for the second multiplication transistor 252. The entire first Miller multiplication circuit 250 is easy to control and works in a relatively stable working state. In addition, the first Miller multiplication circuit can further provide a more suitable gain and multiply the first load capacitance to a more suitable size range, thereby providing a suitable oscillation-starting transconductance range for the second oscillating transistor 212.

In the embodiments of the present application as shown in FIG. 4 and FIG. 5, the crystal oscillator 200 includes only the first Miller multiplication circuit 250, which is connected in parallel to two terminals of the first load capacitor 230 and is configured to multiply the first load capacitance.

Figure 6:
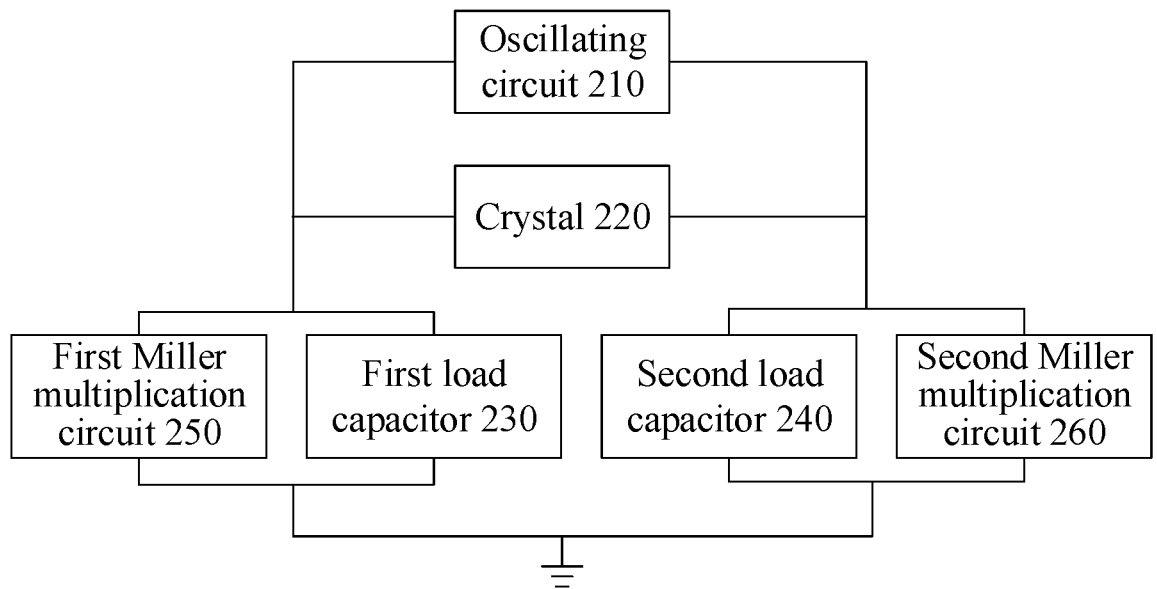
FIG. 6 is another schematic structural block diagram of another crystal oscillator according to an embodiment of the present application.
Figure 7:
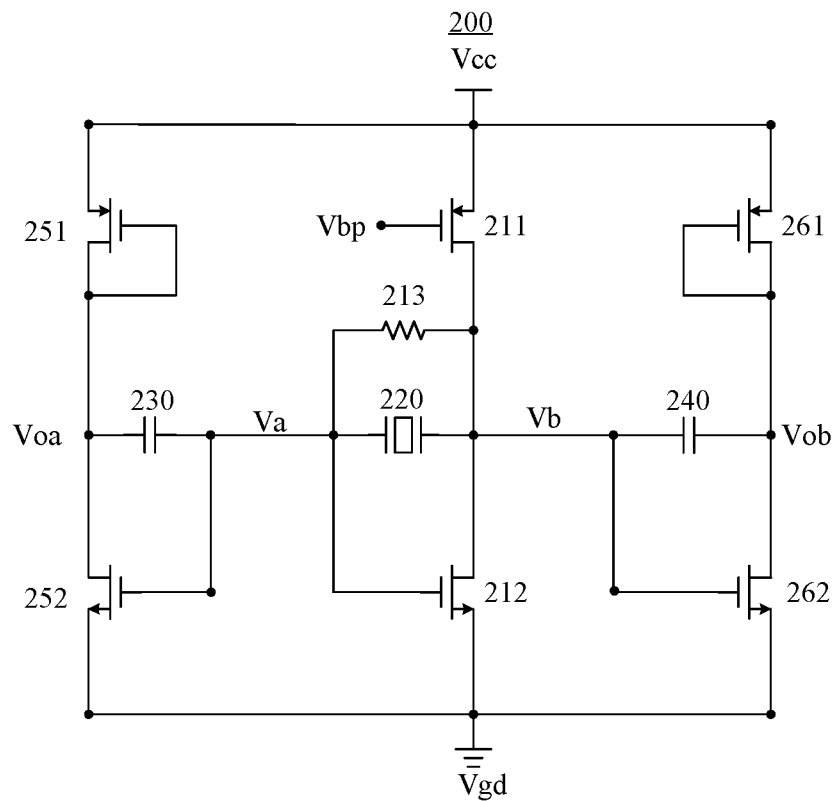
FIG. 7 to FIG. 13 are structural diagrams of circuits of several other crystal oscillators according to an embodiment of the present application.

FIG. 6 and FIG. 7 are respectively a structural block diagram and a schematic structural diagram of circuits of two other crystal oscillators 200 according to an embodiment of the present application.

As shown in FIG. 6 and FIG. 7, the crystal oscillator 200 further includes: a second Miller multiplication circuit 260, which is connected in parallel to two terminals of the second load capacitor 240 and is configured to multiply the second load capacitance, where the second load capacitance is a capacitance between the second terminal of the crystal 220 and the ground.

It may be understood that, for related technical solutions of the second Miller multiplication circuit 260, reference may be made to the related description of the foregoing first Miller multiplication circuit 250, and details are not described herein again.

As an example, as shown in FIG. 7, a circuit structure of the second Miller multiplication circuit 260 is the same as the circuit structure of the first Miller multiplication circuit 250 shown in FIG. 5, and includes an inverting amplifier formed by a third multiplication transistor 261 and a fourth multiplication transistor 262. The second load capacitor 240 is connected between an input terminal $V_b$ and an output terminal $V_{ob}$ of the inverting amplifier, and the input terminal $V_b$ is also the second terminal of the crystal 220.

It may further be understood that, in addition to the circuit structure shown in FIG. 7, the second Miller multiplication circuit 260 may also be other types of inverting amplification circuits, and a specific circuit type and circuit structure may be the same as or different from that of the first Miller multiplication circuit 250, which is not specifically limited in the embodiments of the present application.

In the foregoing embodiment, the load capacitance of the crystal oscillator is multiplied by using the Miller multiplication circuit, so as to improve the stability of oscillation starting of the crystal oscillator. However, after the crystal starts oscillation, the capacitance to maintain the crystal oscillation is often less than a capacitance required to start the oscillation. Especially in low power application scenarios, only a small load capacitance is required. In this case, a capacitance in the load capacitance reserved for the stability of oscillation starting will be wasted.

Based on this problem, further, an embodiment of the present application provides a crystal oscillator including a switch unit group, which can provide a large-capacity load capacitance when the crystal starts oscillation. After the oscillation starting, the crystal maintains oscillation and a small-capacity load capacitance is provided to reduce the power consumption of the crystal oscillator, so that the crystal oscillator can be applied to more low power application scenarios.

Optionally, the crystal oscillator 200 may include: a first switch group configured to connect the first Miller multiplication circuit and the first load capacitor when the crystal oscillator starts oscillation, and to disconnect the first Miller multiplication circuit and the first load capacitor when the crystal oscillator maintains oscillation.

Figure 8:
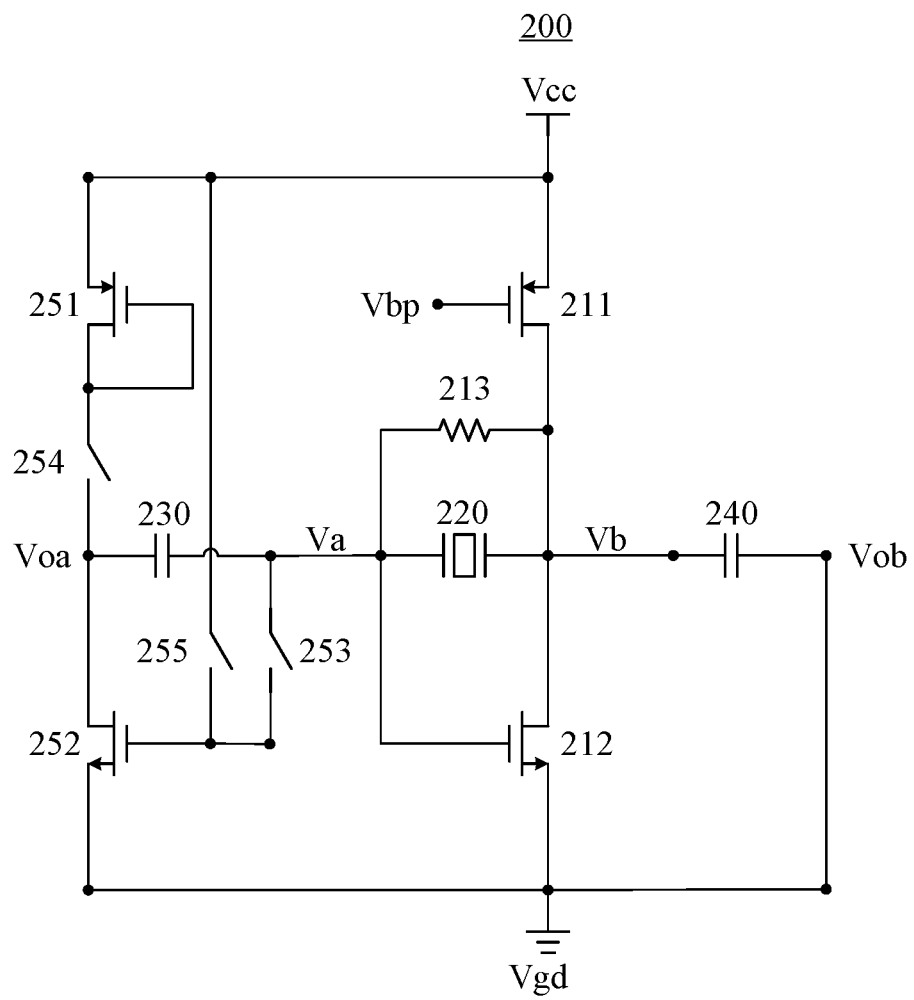

Based on the embodiment of the present application shown in FIG. 5, FIG. 8 is a schematic structural diagram of a circuit of another crystal oscillator 200.

As shown in FIG. 8, in this embodiment of the present application, the first switch group in the crystal oscillator 200 includes: a first switch 253, a second switch 254, and a third switch 255.

The first switch 253 is connected to the gate of the second multiplication transistor 252 and one terminal ($V_a$) of the first load capacitor 230, the second switch 254 is connected to the drain of the first multiplication transistor 251 and the other terminal ($V_{oa}$) of the first load capacitor 230, and the third switch 255 is connected to the gate of the second multiplication transistor 252 and the power supply voltage ($V_{cc}$).

When the first switch 253 and the second switch 254 are both closed, and the third switch 255 is opened, the first load capacitor 230 is connected between the input terminal and the output terminal of the first Miller multiplication circuit 250, to multiply the first load capacitance.

When the third switch 255 is closed, and the first switch 253 and the second switch 254 are both opened, the second multiplication transistor 252 is turned on, and one terminal ($V_{oa}$) of the first load capacitor 230 is grounded. In this case, the first load capacitance is the capacitance of the first load capacitor 230.

Optionally, in this embodiment of the present application, a state of each switch in the first switch group may be controlled by using a control unit, where at the same time, a switch state of the first switch 253 is consistent with that of the second switch 254, and is reverse to that of the third switch 255.

It may be understood that the number of and the positions of the switches in the first switch group in FIG. 8 are merely exemplary descriptions. In addition to the positions shown in FIG. 8, the switches may also be located at other positions in the circuit. For example, the second switch 254 may be configured to connect the source of the first multiplication transistor 251 and the power supply voltage $V_{cc}$, and/or the third switch 255 is configured to connect the gate of the second multiplication transistor 252 and another power supply voltage, and so on. The embodiment of the present application does not specifically limit the positions of the switches in the first switch group, and is intended to control whether the first Miller multiplication circuit 250 is connected to the first load capacitor 230 by using the first switch group.

Optionally, the crystal oscillator 200 may further include: a second switch group configured to connect the second Miller multiplication circuit and the second load capacitor when the crystal oscillator starts oscillation, and to disconnect the second Miller multiplication circuit and the second load capacitor when the crystal oscillator maintains oscillation.

Figure 9:
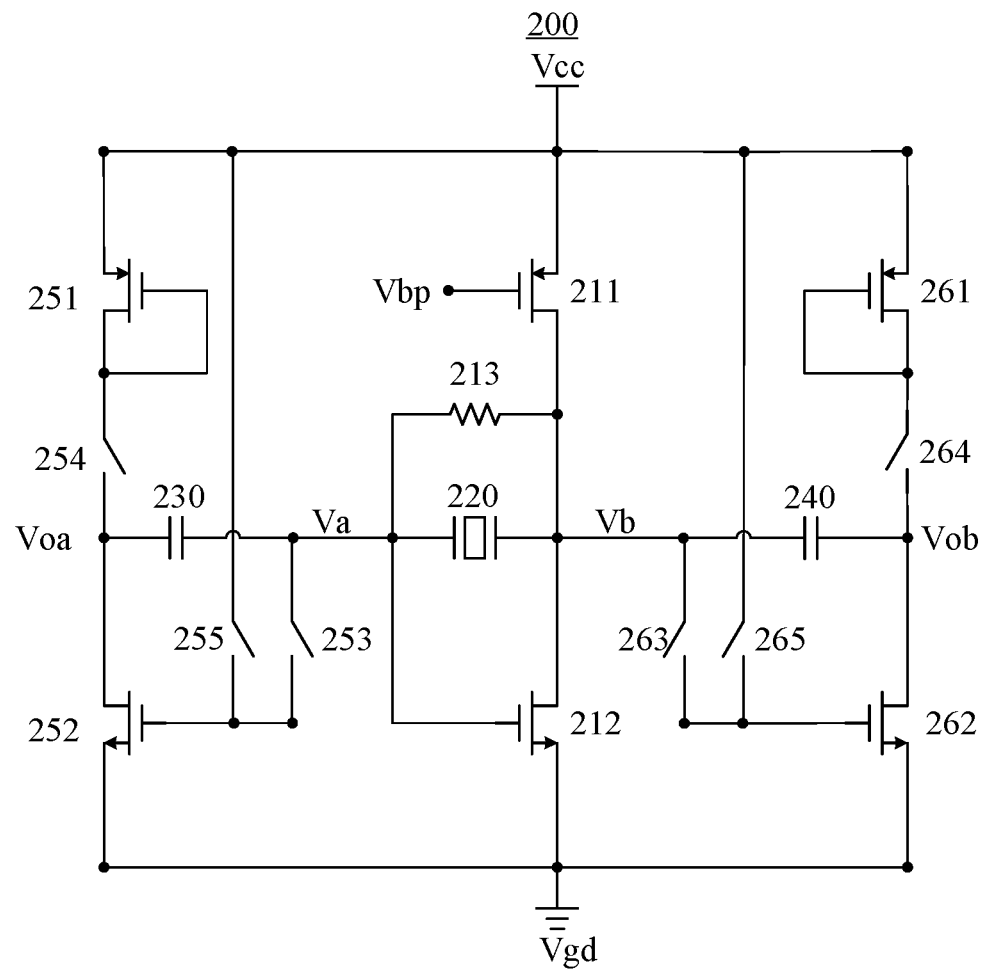

Based on the embodiment of the present application shown in FIG. 7, FIG. 9 is a schematic structural diagram of a circuit of another crystal oscillator 200.

As shown in FIG. 9, in this embodiment of the present application, the second switch group in the crystal oscillator 200 includes: a fourth switch 263, a fifth switch 264, and a sixth switch 265.

The fourth switch 263 is connected to a gate of the fourth multiplication transistor 262 and one terminal ($V_b$) of the second load capacitor 240, and the fifth switch 264 is connected to a drain of the third multiplication transistor 261 and the other terminal ($V_{ob}$) of the second load capacitor 240. The sixth switch 265 is connected to the gate of the fourth multiplication transistor 262 and the power supply voltage $V_{cc}$.

When the fourth switch 263 and the fifth switch 264 are both closed, and the sixth switch 265 is opened, the second load capacitor 240 is connected between the input terminal and the output terminal of the second Miller multiplication circuit 260, to multiply the second load capacitance.

When the sixth switch 265 is closed, and the fourth switch 263 and the fifth switch 264 are both opened, the fourth multiplication transistor 262 is turned on, and one terminal ($V_{ob}$) of the second load capacitor 240 is grounded. In this case, the second load capacitance is the capacitance of the second load capacitor 240.

Optionally, in this embodiment of the present application, a state of each switch in the second switch group may be controlled by using the control unit, where at the same time, a switch state of the fourth switch 263 is consistent with that of the fifth switch 264, and is reverse to that of the sixth switch 265.

Further, in this embodiment of the present application, at the same time, the control unit may control the first switch 253, the second switch 254, the fourth switch 263, and the fifth switch 264 to be in the same switch state, and control the third switch 255 and the sixth switch 265 to be in the same switch state.

Similarly, the number of and the positions of the switches in the second switch group in FIG. 9 are merely exemplary descriptions. In addition to the positions shown in FIG. 9, the switches may also be located at other positions in the circuit. For example, the fifth switch 264 may be configured to connect the source of the third multiplication transistor 261 and the power supply voltage $V_{cc}$, and/or the sixth switch 265 is configured to connect the gate of the fourth multiplication transistor 262 and another power supply voltage, and so on. The embodiment of the application does not specifically limit the positions of the switches in the second switch group.

According to the embodiment described above, the first load capacitor 230 may be connected in parallel to the first Miller multiplication circuit 250, to multiply the first load capacitance, and/or the second load capacitor 240 may be connected in parallel to the second Miller multiplication circuit 260, to multiply the second load capacitance. Specifically, a multiplication amount of the load capacitance is related to a gain of the Miller multiplication circuit.

In the foregoing embodiment, the first Miller multiplication circuit 250 in FIG. 7 to FIG. 9 is taken as an example, and a calculation formula for the gain thereof is as follows:

$$A = -\frac{g_{m52}}{g_{m51}};$$

where $g_{m51}$ and $g_{m52}$ are respectively a transconductance of the first multiplication transistor 251 and a transconductance of the second multiplication transistor 252, and the multiplication amount of the load capacitance may be adjusted by adjusting $g_{m51}$ and $g_{m52}$.

Specifically, a calculation formula for the transconductance $g_{m51}$ of the first multiplication transistor 251 is as follows:

$$g_{m51} = \sqrt{2\mu C_{ox} \frac{W}{L} I_{d51}};$$

where $\mu$ is an electron mobility, $C_{ox}$ is a gate oxide capacitance of the first multiplication transistor 251, W/L is a width-to-length ratio of the first multiplication transistor 251, and $I_{d51}$ is a drain current of the first multiplication transistor 251.

Specifically, the second multiplication transistor 252 is imaged to the second oscillating transistor 212 in the amplification circuit, and calculation formulas for the drain current $I_{d52}$ and the transconductance $g_{m52}$ of the second multiplication transistor 252 are as follows:

$$I_{d52}=NI_B, \text{ and } g_{m52}=Ng_{m12}$$

where N is a ratio of a width-to-length ratio of the second multiplication transistor 252 to a width-to-length ratio of the second oscillating transistor 212, $I_B$ is a drain current of the second oscillating transistor 212 and also a drain current of the first oscillating transistor 211, and $g_{m12}$ is a transconductance of the second oscillating transistor 212.

Therefore, it can be seen from the above formulas that the transconductance of the first multiplication transistor 251 may be adjusted by adjusting process conditions such as a width-to-length ratio of the first multiplication transistor 251; and/or the transconductance of the first multiplication transistor 251 may be adjusted by adjusting the drain current of the first multiplication transistor 251, thereby adjusting the gain of the first Miller multiplication circuit 250.

Alternatively, the transconductance of the second multiplication transistor 252 may be adjusted by adjusting process conditions such as a width-to-length ratio of the second multiplication transistor 252; and/or the transconductance of the second multiplication transistor 252 may be adjusted by adjusting the drain current of the second multiplication transistor 252, thereby adjusting the gain of the first Miller multiplication circuit 250.

It may be understood that the circuit structure of the second Miller multiplication circuit 260 shown in FIG. 7 and FIG. 9 is consistent with the circuit structure of the first Miller multiplication circuit 250. For a calculation method and an adjustment method of the gain, reference may be made to the adjustment method for the first Miller multiplication circuit 250 in the context, and details are not described herein again.

Figure 10:
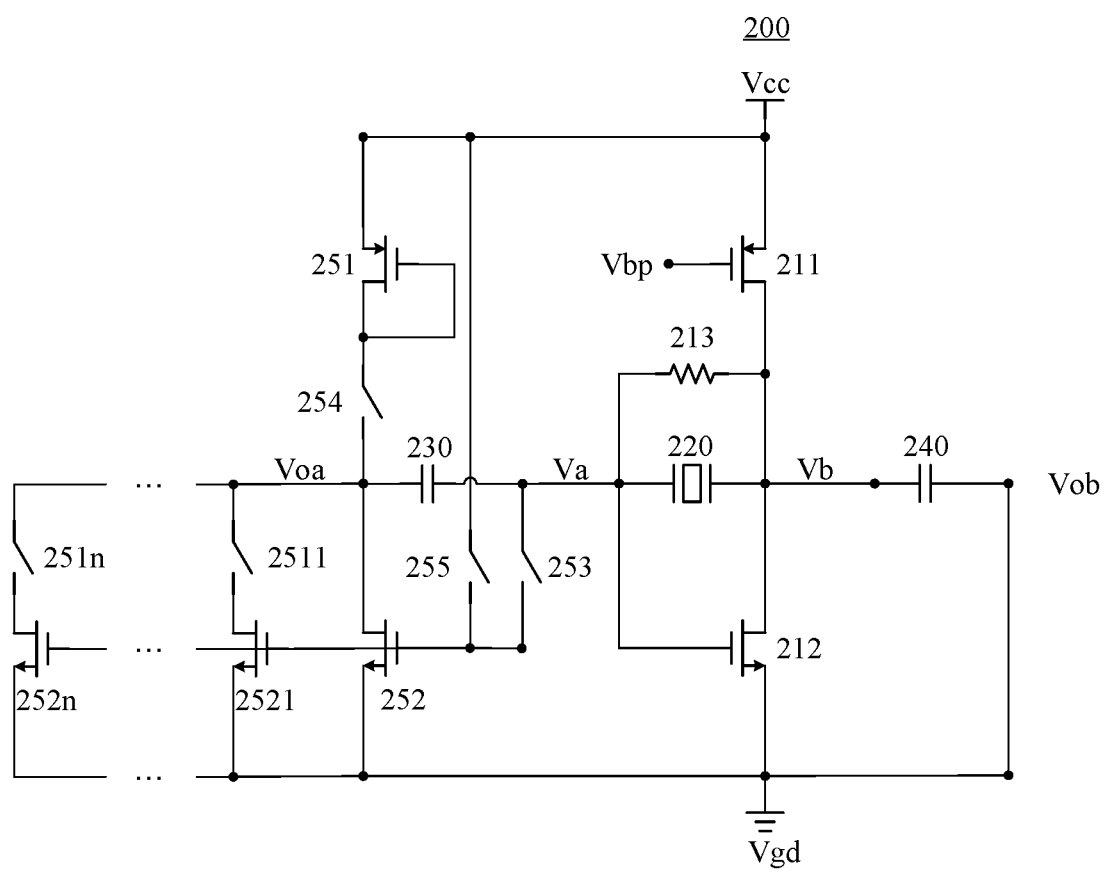
Figure 11:
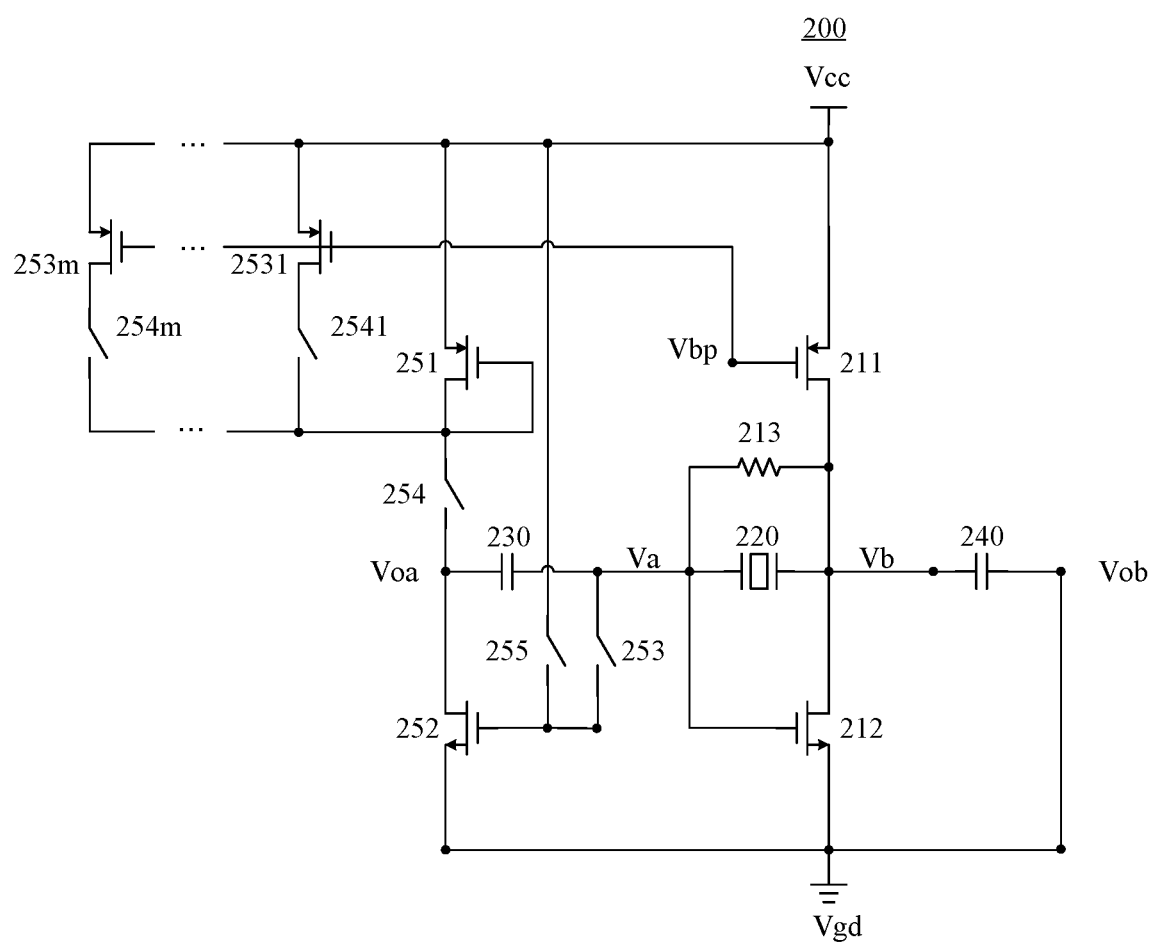
Figure 12:
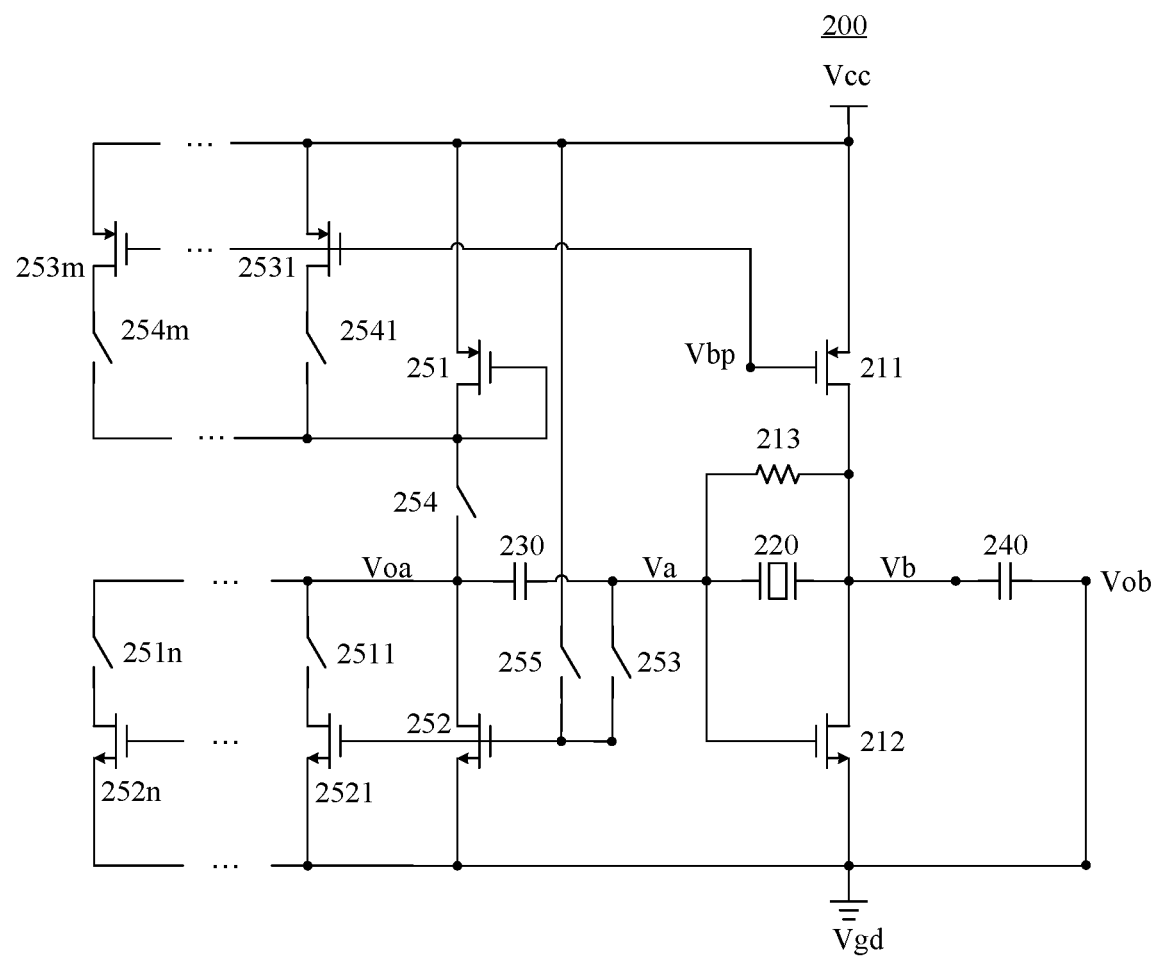

With reference to FIG. 10 to FIG. 12, the following describes the circuit structure of the first Miller multiplication circuit 250 with an adjustable gain.

(1) In a first embodiment:

the transconductance $g_{m52}$ of the second multiplication transistor 252 may be adjusted in a design and manufacturing stage by adjusting the foregoing N, namely, the ratio of the width-to-length ratio of the second multiplication transistor 252 to the width-to-length ratio of the second oscillating transistor 212, thereby adjusting the gain A of the first Miller multiplication circuit 250.

(2) Further, in a second embodiment:

the transconductance $g_{m52}$ of the second multiplication transistor 252 connected in parallel to the transistor may be adjusted in a practical use stage by connecting at least one transistor in parallel to the second multiplication transistor 252 and by adjusting the number of transistors connected in parallel, thereby adjusting the gain A of the first Miller multiplication circuit 250.

As an example, FIG. 10 is a schematic structural diagram of a circuit of another crystal oscillator 200 according to an embodiment.

As shown in FIG. 10, in this embodiment of the present application, the first Miller multiplication circuit 250 further includes:

n second regulating transistors (2521 to 252*n*), where a gate, a source, and a drain of each second regulating transistor in the n second regulating transistors are respectively connected to the gate, the source, and the drain of the second multiplication transistor 252, where n is a positive integer.

Optionally, the first Miller multiplication circuit 250 further includes: n second regulating switches (2511 to 251*n*), where the n second regulating switches are connected to the n second regulating transistors in a one-to-one correspondence, and the second regulating switches are configured to control whether to connect the second regulating transistors to the second multiplication transistor 252.

As an example, as shown in FIG. 10, the n second regulating switches are connected to drains of the n second regulating transistors and one terminal ($V_{oa}$) of the first load capacitor 230 in a one-to-one correspondence.

Optionally, the n second regulating transistors (2521 to 252*n*) may all be NMOS transistors. Further, then second regulating transistors may be transistors having the same structure. Further, the n second regulating transistors may be transistors having the same structure as the second multiplication transistor 252. By using the implementation, the drain current $I_{d52}$ and the transconductance $g_{m52}$ of the second multiplication transistor 252 following the second regulating transistors can be adjusted more conveniently, thereby adjusting the gain A of the first Miller multiplication circuit 250.

If the n second regulating transistors (2521 to 252*n*) are transistors having the same structure as the second multiplication transistor 252, calculation formulas for the drain current $I_{d52}$ and the transconductance $g_{m52}$ of the second multiplication transistor 252 after being connected to the second regulating transistors in the circuit structure shown in FIG. 10 are as follows:

$$I_{d52}=iNI_B, \text{ and } g_{m52}=iNg_{m12};$$

where i denotes the number of second regulating transistors connected to the second multiplication transistor 252, 1≤i≤n, and i is a positive integer. N is a ratio of a width-to-length ratio of the second multiplication transistor 252 to a width-to-length ratio of the second oscillating transistor 212, $I_B$ is a drain current of the second oscillating transistor 212, and $g_{m12}$ is a transconductance of the second oscillating transistor 212.

In a practical application process, one or more parameters of i and N may be adjusted, so as to adjust the transconductance $g_{m52}$ of the second multiplication transistor 252 connected in parallel to the transistor.

(3) In a third embodiment:

the transconductance $g_{m51}$ of the first multiplication transistor 251 may be adjusted by adjusting the drain current $I_{d51}$ of the first multiplication transistor 251, thereby adjusting the gain A of the first Miller multiplication circuit 250.

As an example, FIG. 11 is a schematic structural diagram of a circuit of another crystal oscillator 200 according to an embodiment.

As shown in FIG. 11, in this embodiment of the present application, the first Miller multiplication circuit 250 further includes:

m first regulating transistors (2531 to 253m), where a source and a drain of each first regulating transistor in the m first regulating transistors are respectively connected to the source and the drain of the first multiplication transistor 251, and a gate of each first regulating transistor in the m first regulating transistors is connected to a gate control voltage $V_{bp}$, where m is a positive integer.

Optionally, the first Miller multiplication circuit 250 further includes:

m first regulating switches (2541 to 254m), where the m first regulating switches are connected to the m regulating transistors in a one-to-one correspondence, and the first regulating switches are configured to control whether to connect the first regulating transistors to the first multiplication transistor 251.

As an example, as shown in FIG. 11, the m first regulating switches are connected to drains of the m first regulating transistors and the drain of the first multiplication transistor 251 in a one-to-one correspondence.

Optionally, the m first regulating transistors are all PMOS transistors, and further, the m first regulating transistors may be transistors having the same structure.

If the m first regulating transistors (2531 to 253m) are transistors having the same structure, and a drain current of each first regulating transistor is $I_{d53}$, a calculation formula for the drain $I_{d51}$ of the first multiplication transistor 251 in the circuit structure shown in FIG. 11 is as follows:

$I_{d51}=I_{d52}-jI_{d53}$;

where $I_{d52}=NI_B$, N is a ratio of a width-to-length ratio of the second multiplication transistor 252 to a width-to-length ratio of the second oscillating transistor 212, $I_B$ is a drain current of the second oscillating transistor 212, j denotes the number of first regulating transistors connected in parallel to the first multiplication transistor 251, 1≤j≤m, and j is a positive integer.

Further, if the m first regulating transistors (2531 to 253m) are transistors having the same structure, and a ratio of a width-to-length ratio of each first regulating transistor to a width-to-length ratio of the first oscillating transistor 211 is M, calculation formulas for the drain current $I_{d53}$ of the first regulating transistor, and the drain $I_{d51}$ and the transconductance $g_{m51}$ of the first multiplication transistor 251 are as follows:

$$I_{d53}=MI_B, I_{d51}=NI_B-jMI_B, \text{ and } g_{m51}=\sqrt{2\mu C_{ox}\frac{W}{L}(N-jM)I_B}.$$

It can be seen from the foregoing formulas that in a practical application process, one or more parameters of j, M, and N may be adjusted, so as to adjust the transconductance $g_{m51}$ of the first multiplication transistor 251.

(4) In a fourth embodiment:

the technical solutions of the second and third embodiments described above are combined, the transconductance $g_{m52}$ of the second multiplication transistor 252 may be adjusted in a practical use stage by controlling the number of second regulating transistors connected in parallel to the second multiplication transistor 252, and the transconductance $g_{m51}$ of the first multiplication transistor 251 may be adjusted by adjusting the drain current $I_{d51}$ of the first multiplication transistor 251, thereby adjusting the gain A of the first Miller multiplication circuit 250.

As an example, FIG. 12 is a schematic structural diagram of a circuit of another crystal oscillator 200 according to an embodiment.

As shown in FIG. 12, in this embodiment of the present application, the first Miller multiplication circuit 250 further includes: m first regulating transistors and m first regulating switches, and n second regulating transistors and n second regulating switches. For the m first regulating transistors and the m first regulating switches, and the n second regulating transistors and the n second regulating switches, reference may be made to the related description of FIG. 10 and FIG. 11 above, and details are not described herein again.

In the circuit structure shown in FIG. 12, calculation formulas for the drain current $I_{d52}$ and the transconductance $g_{m52}$ of the second multiplication transistor 252 are as follows:

$I_{d52}=iNI_B$, and $g_{m52}=iNg_{m12}$;

where i denotes the number of second regulating transistors connected to the second multiplication transistor 252, 1≤i≤n, i is a positive integer, N is a ratio of a width-to-length ratio of the second multiplication transistor 252 to a width-to-length ratio of the second oscillating transistor 212, $I_B$ is a drain current of the second oscillating transistor 212, and $g_{m12}$ is a transconductance of the second oscillating transistor 212.

Calculation formulas for the drain $I_{d51}$ and the transconductance $g_{m51}$ of the first multiplication transistor 251 are as follows:

$$I_{d51}=iNI_B-jMI_B, \text{ and } g_{m51}=\sqrt{2\mu C_{ox}\frac{W}{L}(iN-jM)I_B};$$

where j denotes the number of first regulating transistors connected to the first multiplication transistor 251, 1≤j≤m, and j is a positive integer. M is a ratio of a width-to-length ratio of the second regulating transistor to a width-to-length ratio of the first oscillating transistor 211.

It can be seen from the foregoing formulas that in a practical application process, one or more parameters of i, j, M, and N may be controlled to adjust the transconductance $g_{m52}$ of the second multiplication transistor 252 and the transconductance $g_{m51}$ of the first multiplication transistor 251, so as to adjust the gain A of the first Miller multiplication circuit 250.

In the foregoing embodiment of the present application, the gain A of the first Miller multiplication circuit 250 is adjusted, and the first load capacitance in the crystal oscillator is adjusted to an appropriate value, so that the crystal oscillator is easy to start oscillation. Meanwhile, a new means is also provided for adjusting the oscillation frequency of the crystal oscillator.

In combination with the circuit structure of the first Miller multiplication circuit 250 with an adjustable gain in FIG. 10 to FIG. 12 above, it may be understood that the circuit structure of the second Miller multiplication circuit 260 may be consistent with any circuit structure of the first Miller multiplication circuit 250 described above.

Figure 13:
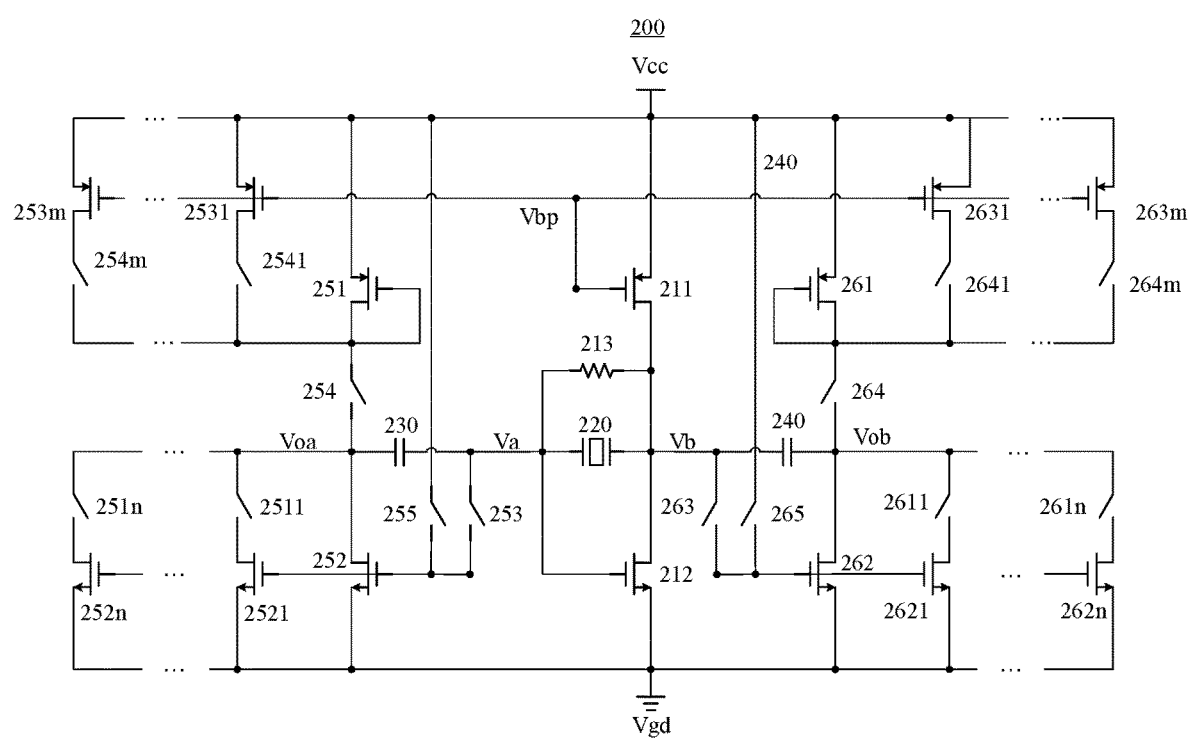

As an example, FIG. 13 is a schematic diagram of a circuit structure of a preferred crystal oscillator 200 according to the present application.

As shown in FIG. 13, the crystal oscillator 200 includes a first Miller multiplication circuit 250 and a second Miller multiplication circuit 260, where the circuit structure of the first Miller multiplication circuit 250 is consistent with that of the first Miller multiplication circuit 250 in FIG. 12, and the circuit structure of the second Miller multiplication circuit 260 is imaged to the first Miller multiplication circuit 250.

Specifically, as shown in FIG. 13, the second Miller multiplication circuit 260 may include: n third regulating switches (2611 to 261n) and n third regulating transistors (2621 to 262n).

Optionally, the n third regulating transistors (2621 to 262n) are all NMOS transistors. Further, then third regulating transistors may be transistors having the same structure. Further, the n third regulating transistors may be transistors having the same structure as the fourth multiplication transistor 262.

Optionally, the second Miller multiplication circuit 260 may further include: m fourth regulating switches (2641 to 264m) and m fourth regulating transistors (2631 to 263m).

Optionally, the m fourth regulating transistors are all PMOS transistors, and further, the m fourth regulating transistors may be transistors having the same structure.

It may be understood that, in this embodiment of the present application, for related technical solutions of the regulating switches and the regulating transistors in the second Miller multiplication circuit 260, reference may be made to the foregoing related description of the regulating switches and the regulating transistors in the first Miller multiplication circuit 250. For an adjustment method for the gain of the second Miller multiplication circuit 260, reference may also be made to the foregoing adjustment method for the gain of the first Miller multiplication circuit 250. Details are not described herein again.

It may further be understood that, in the embodiment shown in FIG. 13, the number of third regulating transistors and the third regulating switches includes but is not limited to n, and the number of fourth regulating transistors and the fourth regulating switches includes but is not limited to m, which is not specifically limited in this embodiment of the present application.

Moreover, the second Miller multiplication circuit 260 in FIG. 13 is imaged to the first Miller multiplication circuit 250 in FIG. 12. In addition, the second Miller multiplication circuit 260 may also be imaged to the first Miller multiplication circuit 250 in FIG. 10 or FIG. 11. In the crystal oscillator 200, the structures of the first Miller multiplication circuit 250 and the second Miller multiplication circuit 260 may be the same or different, which is not specifically limited in this embodiment of the present application either.

For example, if the structures of the first Miller multiplication circuit 250 and the second Miller multiplication circuit 260 are different, the first Miller multiplication circuit 250 may have the circuit structure shown in FIG. 10, and the second Miller multiplication circuit 260 may be imaged to the circuit structure shown in FIG. 11 or FIG. 12. If the structures of the first Miller multiplication circuit 250 and the second Miller multiplication circuit 260 are the same, the first Miller multiplication circuit 250 has the circuit structure shown in FIG. 10, and the second Miller multiplication circuit 260 is imaged to the circuit structure shown in FIG. 10. Alternatively, the first Miller multiplication circuit 250 is the circuit structure shown in FIG. 11, and the second Miller multiplication circuit 260 is imaged to the circuit structure shown in FIG. 11.

An embodiment of the present application further provides a chip, including the crystal oscillator according to the various embodiments of the present application.

In some possible implementations, the chip may be a clock chip, for example a real time clock (RTC) chip, and the clock chip may provide a clock signal for other types of chips, for example, a processor.

An embodiment of the present application further provides an electronic device, and the electronic device includes: the chip according to the foregoing embodiment.

As an example rather than a limitation, the electronic device in the embodiment of the present application may be any device that requires a clock signal, for example, a portable or mobile computing device such as a terminal device, a mobile phone, a tablet computer, a notebook computer, a desktop computer, a game device, an in-vehicle electronic device, or a wearable smart device, and other electronic devices such as an electronic database and an automobile.

It should be noted that, on the premise of no conflict, the embodiments and/or the technical features thereof described in the present application may be arbitrarily combined with each other, and the technical solutions obtained after combination shall also fall within the protection scope of the present application.

It should be understood that the specific examples in the embodiments of the present application are intended only to help persons skilled in the art better understand the embodiments of the present application, rather than limiting the scope of the embodiments of the present application. Persons skilled in the art can make various improvements and modifications on the basis of the foregoing embodiments, all of which shall fall within the protection scope of the present application.

The foregoing descriptions are merely specific implementations of the present application, but the protection scope of the present application is not limited thereto. Any variation or replacement readily figured out by persons skilled in the art within the technical scope disclosed in the present application shall fall within the protection scope of the present application. Therefore, the protection scope of the present application shall be subject to the protection scope of the claims

What is claimed is:

1. A crystal oscillator, comprising:
an oscillating circuit, comprising: a crystal, an amplification circuit, a first load capacitor, and a second load capacitor, wherein two terminals of the crystal are respectively connected to an input terminal and an output terminal of the amplification circuit, and the first load capacitor and the second load capacitor are respectively connected to a first terminal and a second terminal of the crystal; and
a first Miller multiplication circuit, wherein an input terminal and an output terminal of the first Miller multiplication circuit are respectively connected to two terminals of the first load capacitor, and the first Miller multiplication circuit is configured to increase a first load capacitance of the oscillating circuit, wherein the first load capacitance is a capacitance between the first terminal of the crystal and the ground;

a first switch group configured to connect the first Miller multiplication circuit and the first load capacitor when the crystal oscillator starts oscillation, and to disconnect the first Miller multiplication circuit and the first load capacitor when the crystal oscillator maintains oscillation.

2. The crystal oscillator according to claim 1, wherein the first Miller multiplication circuit is configured to increase the first load capacitance to A+1 times a capacitance of the first load capacitor, and A is a gain of the first Miller multiplication circuit.

3. The crystal oscillator according to claim 2, wherein the first Miller multiplication circuit comprises: a first multiplication transistor and a second multiplication transistor, wherein the first multiplication transistor and the second multiplication transistor are connected in series to form an inverting amplification circuit;

a gate and a drain of the first multiplication transistor are connected to each other, a source of the first multiplication transistor is connected to a power supply voltage, and the drain of the first multiplication transistor is connected to a drain of the second multiplication transistor; and a gate of the second multiplication transistor is the input terminal of the first Miller multiplication circuit and is connected to one terminal of the first load capacitor, the drain of the second multiplication transistor is the output terminal of the first Miller multiplication circuit and is connected to the other terminal of the first load capacitor, and a source of the second multiplication transistor is connected to the ground.

4. The crystal oscillator according to claim 3, wherein the first Miller multiplication circuit further comprises:

at least one first regulating transistor, wherein a source and a drain of each first regulating transistor in the at least one first regulating transistor are respectively connected to the source and the drain of the first multiplication transistor, and a gate of each first regulating transistor in the at least one first regulating transistor is connected to a gate control voltage.

5. The crystal oscillator according to claim 4, wherein the first Miller multiplication circuit further comprises:

at least one first regulating switch, wherein the at least one first regulating switch is connected to the at least one first regulating transistor in a one-to-one correspondence, and the first regulating switch is configured to control whether to connect the first regulating transistor to the first multiplication transistor; and the at least one first regulating switch is configured to adjust a transconductance of the first multiplication transistor, so as to adjust a gain A of the first Miller multiplication circuit.

6. The crystal oscillator according to claim 4, wherein if the at least one first regulating transistor is a plurality of first regulating transistors, the plurality of first regulating transistors are transistors having the same structure.

7. The crystal oscillator according to claim 3, wherein the first Miller multiplication circuit further comprises:

at least one second regulating transistor, wherein a gate, a source, and a drain of each second regulating transistor in the at least one second regulating transistor are respectively connected to the gate, the source, and the drain of the second multiplication transistor.

8. The crystal oscillator according to claim 7, wherein the first Miller multiplication circuit further comprises:

at least one second regulating switch, wherein the at least one second regulating switch is connected to the at least one second regulating transistor in a one-to-one correspondence, and the second regulating switch is configured to control whether to connect the second regulating transistor to the second multiplication transistor; and the at least one second regulating switch is configured to adjust a transconductance of the second multiplication transistor, so as to adjust the gain A of the first Miller multiplication circuit.

9. The crystal oscillator according to claim 7, wherein if the at least one second regulating transistor is a plurality of second regulating transistors, the plurality of second regulating transistors are transistors having the same structure.

10. The crystal oscillator according to claim 9, wherein a structure of the at least one second regulating transistor is the same as a structure of the second multiplication transistor.

11. The crystal oscillator according to claim 3, wherein the amplification circuit comprises a first oscillating transistor, a second oscillating transistor, and a feedback resistor, wherein a gate of the first oscillating transistor is connected to a gate control voltage, a drain of the first oscillating transistor is connected to the second terminal of the crystal, and a source of the first oscillating transistor is connected to the power supply voltage;

a gate of the second oscillating transistor is connected to the first terminal of the crystal, a drain of the second oscillating transistor is connected to the second terminal of the crystal, and a source of the second oscillating transistor is connected to the ground; and two terminals of the feedback resistor are respectively connected to the two terminals of the crystal.

12. The crystal oscillator according to claim 11, wherein a ratio of a width-to-length ratio of the second multiplication transistor to a width-to-length ratio of the second oscillating transistor is used to adjust the transconductance of the second multiplication transistor and the transconductance of the first multiplication transistor, so as to adjust the gain A of the first Miller multiplication circuit.

13. The crystal oscillator according to claim 11, wherein a ratio of a width-to-length ratio of the second regulating transistor to a width-to-length ratio of the first oscillating transistor is used to adjust the transconductance of the first multiplication transistor, so as to adjust the gain A of the first Miller multiplication circuit.

14. The crystal oscillator according to claim 1, wherein the first switch group comprises: a first switch, a second switch, and a third switch, wherein the first switch is connected to the gate of the second multiplication transistor and one terminal of the first load capacitor, the second switch is connected to the drain of the first multiplication transistor and the other terminal of the first load capacitor, and the third switch is connected to the gate of the second multiplication transistor and the power supply voltage;

when the crystal oscillator starts oscillation, the first switch and the second switch are closed, the third switch is opened, and the first Miller multiplication circuit is connected to the first load capacitor to increase the first load capacitance of the oscillating circuit; and when the crystal oscillator maintains oscillation, the third switch is closed, the first switch and the second switch are opened, and the first load capacitance of the oscillating circuit is equal to the capacitance of the first load capacitor.

15. The crystal oscillator according to claim 1, further comprising: a second Miller multiplication circuit, wherein an input terminal and an output terminal of the second Miller multiplication circuit are respectively connected to two terminals of the first load capacitor, and the second Miller multiplication circuit is configured to increase a second load capacitance of the oscillating circuit, wherein the second load capacitance is a capacitance between the second terminal of the crystal and the ground.

16. The crystal oscillator according to claim 1, wherein a circuit structure of the second Miller multiplication circuit is the same as a circuit structure of the first Miller multiplication circuit.

17. A chip, comprising:
the crystal oscillator according to claim 1.

18. The chip according to claim 17, wherein the chip is a clock chip, and the clock chip is configured to provide a clock signal.

19. An electronic device, comprising:
the chip according to claim 18.

\* \* \* \* \*